(12) United States Patent
Smith et al.

(10) Patent No.: US 7,471,339 B2
(45) Date of Patent: Dec. 30, 2008

(54) HIGH-SPEED VIDEO SIGNAL PROCESSING SYSTEM

(75) Inventors: Sterling Smith, Hsin-Chu Hsien (TW); Chia-Ming Yang, Hsin-Chu (TW); Chih-Shiun Lu, Hsin-Chu Hsien (TW)

(73) Assignee: MStar Semiconductor, Inc., ChuPei, Hsin-Chu Hsien (TW)

( * ) Notice: Subject to any disclaimer, the term of this patent is extended or adjusted under 35 U.S.C. 154(b) by 532 days.

(21) Appl. No.: 10/908,743

(22) Filed: May 24, 2005

(65) Prior Publication Data

US 2005/0270212 A1    Dec. 8, 2005

Related U.S. Application Data

(60) Provisional application No. 60/576,024, filed on Jun. 2, 2004, provisional application No. 60/576,022, filed on Jun. 2, 2004.

(51) Int. Cl.
*H03M 1/12* (2006.01)
(52) U.S. Cl. ............... 348/572; 348/678; 348/705; 341/155
(58) Field of Classification Search ............... 348/572, 348/573, 678, 689, 705–706; 341/155, 126, 341/158–160; *H03M 1/12*
See application file for complete search history.

(56) References Cited

U.S. PATENT DOCUMENTS

| | | | | | |
|---|---|---|---|---|---|
| 4,768,015 | A | * | 8/1988 | Amano | 348/572 |
| 5,742,711 | A | * | 4/1998 | Lin et al. | 382/275 |
| 6,097,443 | A | * | 8/2000 | Volmari | 348/572 |
| 6,882,371 | B2 | * | 4/2005 | Suzuki | 348/572 |
| 7,023,494 | B2 | * | 4/2006 | Yun | 348/572 |
| 2003/0063219 | A1 | * | 4/2003 | Bellers | 348/572 |

FOREIGN PATENT DOCUMENTS

| | | |
|---|---|---|
| JP | 9-167964 | 6/1997 |
| JP | 2000-134637 | 5/2000 |

* cited by examiner

*Primary Examiner*—Trang U Tran
(74) *Attorney, Agent, or Firm*—Winston Hsu (57) ABSTRACT

A high-speed video signal processing system, which includes a reception end for receiving analog signals; a plurality of analog to digital converters coupled to the reception end for converting analog signals received from the reception end to digital signals according to control signals; and an interleaving controller coupled to the plurality of analog to digital converters for generating the control signals to selectively enable the plurality of analog to digital converters according to a predetermined sequence.

10 Claims, 11 Drawing Sheets

|       | Pix1    | Pix2    | Pix3    | Pix4    | Pix5    | Pix6    | Pix7    | Pix8    |
|-------|---------|---------|---------|---------|---------|---------|---------|---------|
| Line1 | ADC 108 | ADC 110 | ADC 108 | ADC 110 | ADC 108 | ADC 110 | ADC 108 | ADC 110 |
| Line2 | ADC 108 | ADC 110 | ADC 108 | ADC 110 | ADC 108 | ADC 110 | ADC 108 | ADC 110 |
| Line3 | ADC 108 | ADC 110 | ADC 108 | ADC 110 | ADC 108 | ADC 110 | ADC 108 | ADC 110 |
| Line4 | ADC 108 | ADC 110 | ADC 108 | ADC 110 | ADC 108 | ADC 110 | ADC 108 | ADC 110 |
| Line5 | ADC 108 | ADC 110 | ADC 108 | ADC 110 | ADC 108 | ADC 110 | ADC 108 | ADC 110 |
| Line6 | ADC 108 | ADC 110 | ADC 108 | ADC 110 | ADC 108 | ADC 110 | ADC 108 | ADC 110 |
| Line7 | ADC 108 | ADC 110 | ADC 108 | ADC 110 | ADC 108 | ADC 110 | ADC 108 | ADC 110 |
| Line8 | ADC 108 | ADC 110 | ADC 108 | ADC 110 | ADC 108 | ADC 110 | ADC 108 | ADC 110 |

Fig. 3

|       | Pix1    | Pix2    | Pix3    | Pix4    | Pix5    | Pix6    | Pix7    | Pix8    |
|-------|---------|---------|---------|---------|---------|---------|---------|---------|
| Line1 | ADC 108 | ADC 110 | ADC 108 | ADC 110 | ADC 108 | ADC 110 | ADC 108 | ADC 110 |
| Line2 | ADC 110 | ADC 108 | ADC 110 | ADC 108 | ADC 110 | ADC 108 | ADC 110 | ADC 108 |
| Line3 | ADC 108 | ADC 110 | ADC 108 | ADC 110 | ADC 108 | ADC 110 | ADC 108 | ADC 110 |
| Line4 | ADC 110 | ADC 108 | ADC 110 | ADC 108 | ADC 110 | ADC 108 | ADC 110 | ADC 108 |
| Line5 | ADC 108 | ADC 110 | ADC 108 | ADC 110 | ADC 108 | ADC 110 | ADC 108 | ADC 110 |
| Line6 | ADC 110 | ADC 108 | ADC 110 | ADC 108 | ADC 110 | ADC 108 | ADC 110 | ADC 108 |
| Line7 | ADC 108 | ADC 110 | ADC 108 | ADC 110 | ADC 108 | ADC 110 | ADC 108 | ADC 110 |
| Line8 | ADC 110 | ADC 108 | ADC 110 | ADC 108 | ADC 110 | ADC 108 | ADC 110 | ADC 108 |

Fig. 4

|       | Pix1    | Pix2    | Pix3    | Pix4    | Pix5    | Pix6    | Pix7    | Pix8    |
|-------|---------|---------|---------|---------|---------|---------|---------|---------|
| Line1 | ADC 108 | ADC 110 | ADC 108 | ADC 110 | ADC 108 | ADC 110 | ADC 108 | ADC 110 |
| Line2 | ADC 108 | ADC 110 | ADC 108 | ADC 110 | ADC 108 | ADC 110 | ADC 108 | ADC 110 |
| Line3 | ADC 110 | ADC 108 | ADC 110 | ADC 108 | ADC 110 | ADC 108 | ADC 110 | ADC 108 |
| Line4 | ADC 110 | ADC 108 | ADC 110 | ADC 108 | ADC 110 | ADC 108 | ADC 110 | ADC 108 |
| Line5 | ADC 108 | ADC 110 | ADC 108 | ADC 110 | ADC 108 | ADC 110 | ADC 108 | ADC 110 |
| Line6 | ADC 108 | ADC 110 | ADC 108 | ADC 110 | ADC 108 | ADC 110 | ADC 108 | ADC 110 |
| Line7 | ADC 110 | ADC 108 | ADC 110 | ADC 108 | ADC 110 | ADC 108 | ADC 110 | ADC 108 |
| Line8 | ADC 110 | ADC 108 | ADC 110 | ADC 108 | ADC 110 | ADC 108 | ADC 110 | ADC 108 |

Fig. 5

| | Pix1 | Pix2 | Pix3 | Pix4 | Pix5 | Pix6 | Pix7 | Pix8 |
|---|---|---|---|---|---|---|---|---|
| Line1 | ADC 108 | ADC 110 | ADC 108 | ADC 110 | ADC 108 | ADC 110 | ADC 108 | ADC 110 |
| Line2 | ADC 110 | ADC 108 | ADC 110 | ADC 108 | ADC 110 | ADC 108 | ADC 110 | ADC 108 |
| Line3 | ADC 108 | ADC 110 | ADC 108 | ADC 110 | ADC 108 | ADC 110 | ADC 108 | ADC 110 |
| Line4 | ADC 110 | ADC 108 | ADC 110 | ADC 108 | ADC 110 | ADC 108 | ADC 110 | ADC 108 |
| Line5 | ADC 108 | ADC 110 | ADC 108 | ADC 110 | ADC 108 | ADC 110 | ADC 108 | ADC 110 |
| Line6 | ADC 110 | ADC 108 | ADC 110 | ADC 108 | ADC 110 | ADC 108 | ADC 110 | ADC 108 |
| Line7 | ADC 108 | ADC 110 | ADC 108 | ADC 110 | ADC 108 | ADC 110 | ADC 108 | ADC 110 |
| Line8 | ADC 110 | ADC 108 | ADC 110 | ADC 108 | ADC 110 | ADC 108 | ADC 110 | ADC 108 |

Frame 1,3,5,7

Fig. 6

| | Pix1 | Pix2 | Pix3 | Pix4 | Pix5 | Pix6 | Pix7 | Pix8 |
|---|---|---|---|---|---|---|---|---|
| Line1 | ADC 110 | ADC 108 | ADC 110 | ADC 108 | ADC 110 | ADC 108 | ADC 110 | ADC 108 |
| Line2 | ADC 108 | ADC 110 | ADC 108 | ADC 110 | ADC 108 | ADC 110 | ADC 108 | ADC 110 |
| Line3 | ADC 110 | ADC 108 | ADC 110 | ADC 108 | ADC 110 | ADC 108 | ADC 110 | ADC 108 |
| Line4 | ADC 108 | ADC 110 | ADC 108 | ADC 110 | ADC 108 | ADC 110 | ADC 108 | ADC 110 |
| Line5 | ADC 110 | ADC 108 | ADC 110 | ADC 108 | ADC 110 | ADC 108 | ADC 110 | ADC 108 |
| Line6 | ADC 108 | ADC 110 | ADC 108 | ADC 110 | ADC 108 | ADC 110 | ADC 108 | ADC 110 |
| Line7 | ADC 110 | ADC 108 | ADC 110 | ADC 108 | ADC 110 | ADC 108 | ADC 110 | ADC 108 |
| Line8 | ADC 108 | ADC 110 | ADC 108 | ADC 110 | ADC 108 | ADC 110 | ADC 108 | ADC 110 |

Frame 2,4,6,8

Fig. 7

|   | Pix1 | Pix2 | Pix3 | Pix4 | Pix5 | Pix6 | Pix7 | Pix8 |
|---|---|---|---|---|---|---|---|---|
| Line1 | ADC 108 | ADC 110 | ADC 108 | ADC 110 | ADC 108 | ADC 110 | ADC 108 | ADC 110 |
| Line2 | ADC 110 | ADC 108 | ADC 110 | ADC 108 | ADC 110 | ADC 108 | ADC 110 | ADC 108 |
| Line3 | ADC 108 | ADC 110 | ADC 108 | ADC 110 | ADC 108 | ADC 110 | ADC 108 | ADC 110 |
| Line4 | ADC 110 | ADC 108 | ADC 110 | ADC 108 | ADC 110 | ADC 108 | ADC 110 | ADC 108 |
| Line5 | ADC 108 | ADC 110 | ADC 108 | ADC 110 | ADC 108 | ADC 110 | ADC 108 | ADC 110 |
| Line6 | ADC 110 | ADC 108 | ADC 110 | ADC 108 | ADC 110 | ADC 108 | ADC 110 | ADC 108 |
| Line7 | ADC 108 | ADC 110 | ADC 108 | ADC 110 | ADC 108 | ADC 110 | ADC 108 | ADC 110 |
| Line8 | ADC 110 | ADC 108 | ADC 110 | ADC 108 | ADC 110 | ADC 108 | ADC 110 | ADC 108 |

Frame 1,2,5,6

Fig. 8

|      | Pix1    | Pix2    | Pix3    | Pix4    | Pix5    | Pix6    | Pix7    | Pix8    |
|------|---------|---------|---------|---------|---------|---------|---------|---------|
| Line1 | ADC 110 | ADC 108 | ADC 110 | ADC 108 | ADC 110 | ADC 108 | ADC 110 | ADC 108 |
| Line2 | ADC 108 | ADC 110 | ADC 108 | ADC 110 | ADC 108 | ADC 110 | ADC 108 | ADC 110 |
| Line3 | ADC 110 | ADC 108 | ADC 110 | ADC 108 | ADC 110 | ADC 108 | ADC 110 | ADC 108 |
| Line4 | ADC 108 | ADC 110 | ADC 108 | ADC 110 | ADC 108 | ADC 110 | ADC 108 | ADC 110 |
| Line5 | ADC 110 | ADC 108 | ADC 110 | ADC 108 | ADC 110 | ADC 108 | ADC 110 | ADC 108 |
| Line6 | ADC 108 | ADC 110 | ADC 108 | ADC 110 | ADC 108 | ADC 110 | ADC 108 | ADC 110 |
| Line7 | ADC 110 | ADC 108 | ADC 110 | ADC 108 | ADC 110 | ADC 108 | ADC 110 | ADC 108 |
| Line8 | ADC 108 | ADC 110 | ADC 108 | ADC 110 | ADC 108 | ADC 110 | ADC 108 | ADC 110 |

Frame 3,4,7,8

Fig. 11

HIGH-SPEED VIDEO SIGNAL PROCESSING SYSTEM

CROSS REFERENCE TO RELATED APPLICATIONS

The application claims the benefit of U.S. Provisional Application No. 60/576,024, filed Jun. 2, 2004, U.S. Provisional Application No. 60/576,022, filed Jun. 2, 2004, and included herein by references.

BACKGROUND OF INVENTION

1. Field of the Invention

The present invention provides a video signal processing system, and more particularly, a video signal processing system with interleaving analog to digital converters and calibration loops, so as to increase operating speed and accuracy.

2. Description of the Prior Art

Analog to digital converters (ADC) are utilized broadly in signal processing systems for converting analog signals into digital signals. Owing to high-speed requirements, a signal processing system operating in high speed is expected.

Besides, calibrations of an ADC are usually accomplished before hardwares of the ADC leave a factory. However, the performance of the ADC is distorted as long as the ADC is used. In video signal processing systems, such as TVs, digital TVs, and etc., performance and accuracy of ADCs are very important for the quality of video display. Conventionally, ADCs in video signal processing systems degrade with time.

Therefore, a high-speed signal processing system with a calibration mechanism is expected.

SUMMARY OF INVENTION

The present invention discloses a high-speed video signal processing system, which includes a reception end for receiving analog signals; a plurality of analog to digital converters coupled to the reception end for converting analog signals received from the reception end to digital signals according to control signals; and an interleaving controller coupled to the plurality of analog to digital converters for generating the control signals to selectively enable the plurality of analog to digital converters according to a predetermined sequence.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
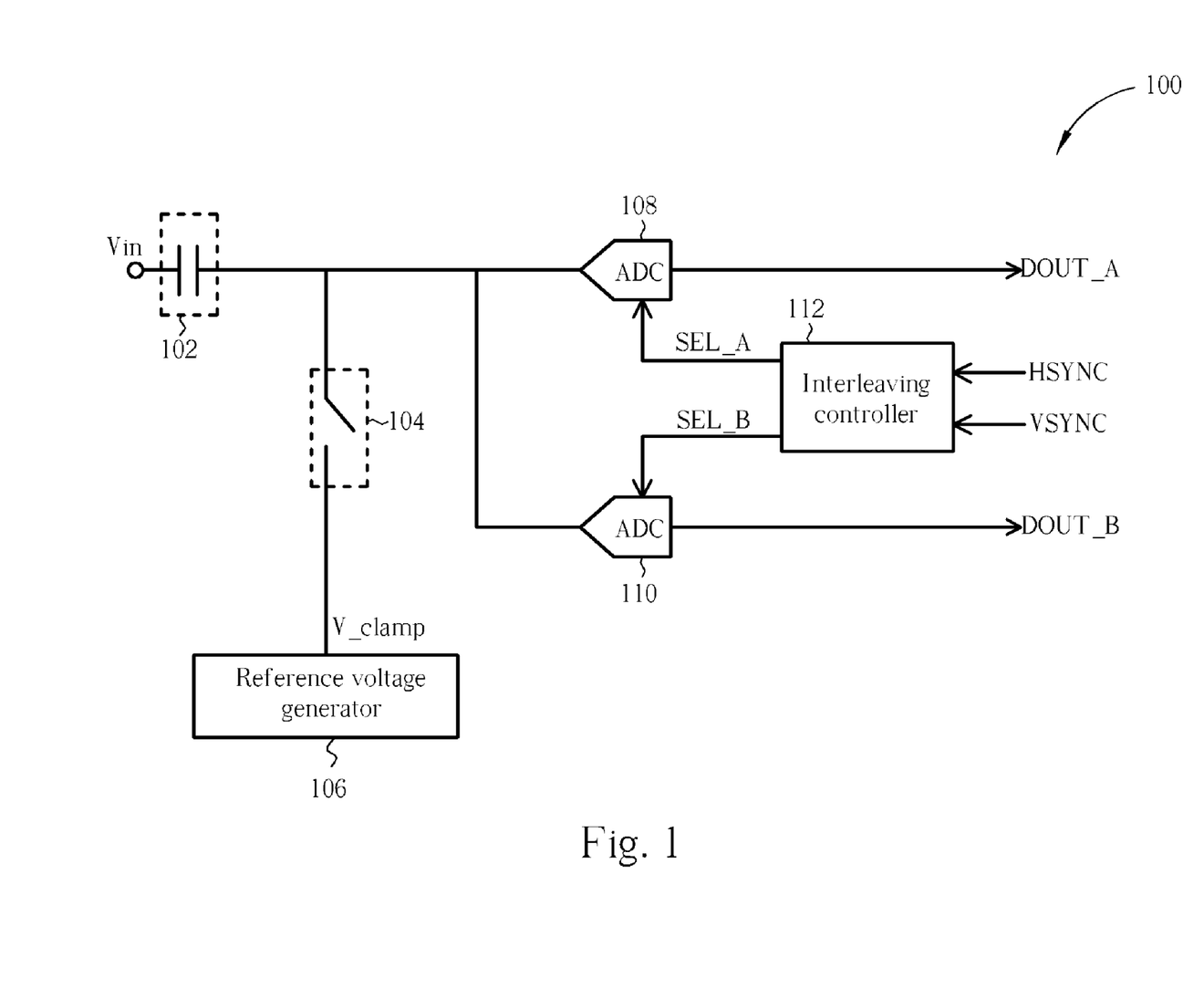
FIG. 1 illustrates a schematic diagram of a high-speed video signal processing system in accordance with the first embodiment of the present invention.

Please refer to FIG. 1, which illustrates a schematic diagram of a high-speed video signal processing system 100 in accordance with the first embodiment of the present invention. The high-speed video signal processing system 100 includes a capacitor 102, a switch 104, a reference voltage generator 106, ADCs 108 and 110, and an interleaving controller 112. The capacitor 102 acts as dc level shift storage for shifting an input signal Vin to an internal ADC operation range. The switch 104 transmits a clamp voltage V_clamp provided by the reference voltage generator 106 to the ADCs 108 and 110 for serving a dc level clamp voltage. The ADCs 108 and 110, controlled by the interleaving controller 112 with selection signals SEL_A and SEL_B, convert received analog signals to digital signals DOUT_A and DOUT_B. The interleaving controller 112 enables the ADCs 108 and 110 by turns and may change the sequence, preferably in response to horizontal synchronization signal HSYNC and vertical synchronization signal VSYNC. With interleaving sampling and conversion, the video signal processing system 100 performs a two-time conversion rate by interleaving the ADC 108 and the ADC 110.

Figure 2:
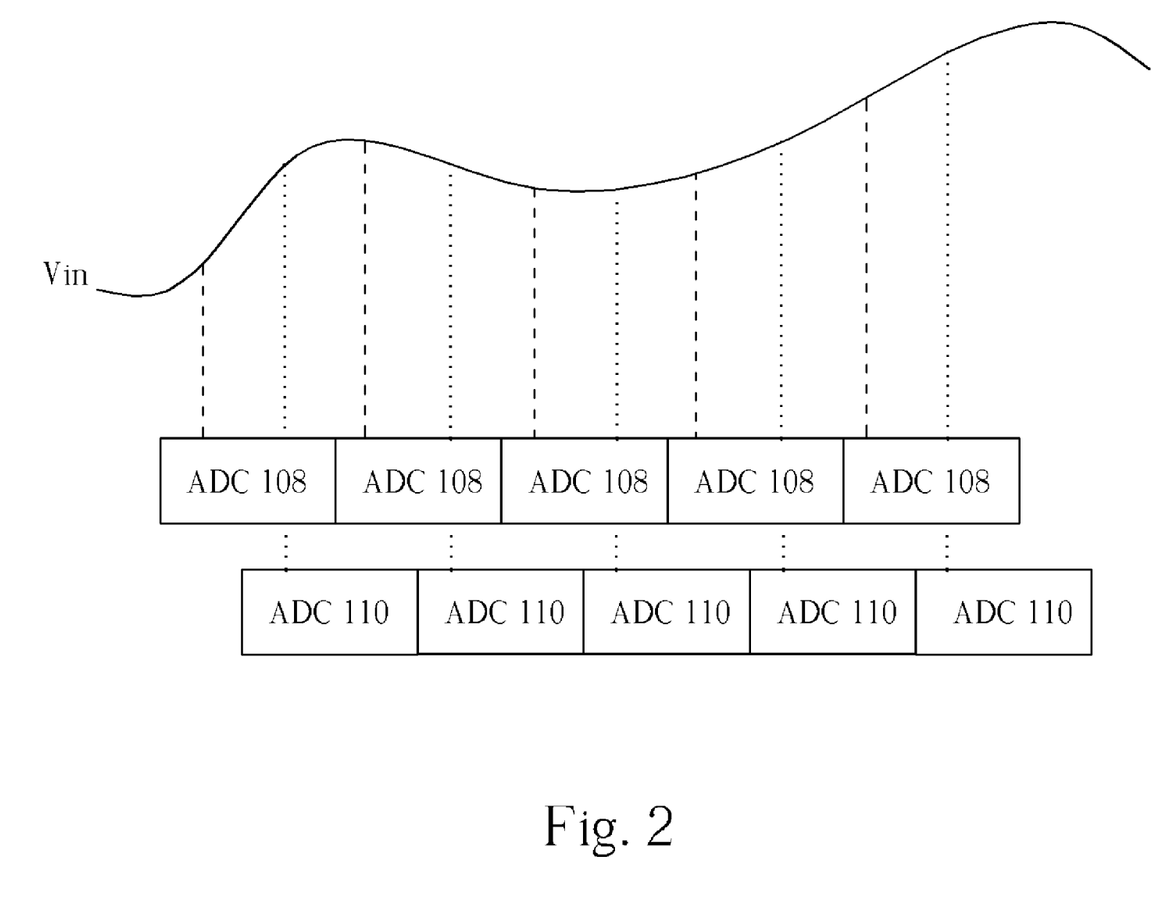
FIG. 2 illustrates a schematic diagram of alternative sampling and conversion by interleaving ADCs in FIG. 1.

Furthermore, please refer to FIG. 2, which illustrates a schematic diagram of alternative sampling and conversion by interleaving the ADC 108 and the ADC 110 in FIG. 1. The video signal processing system 100 converts the input signal Vin with the ADC 108 and the ADC 110 by turns, so that the conversion rate in the video signal processing system 100 is capable of achieving two-time (2×) speed with two ADCs 108 and 110.

Figure 3:
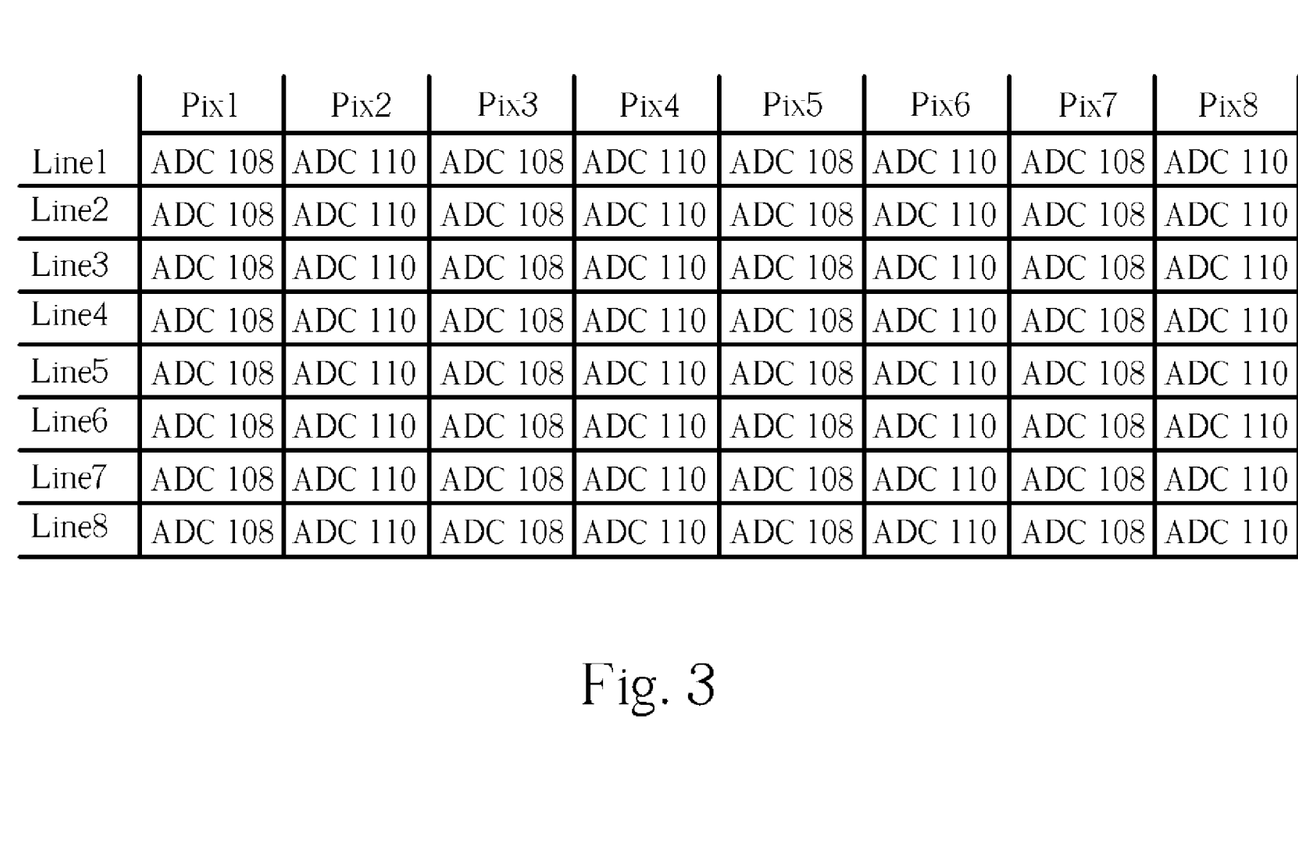
FIG. 3 illustrates a bitmap of image pixels corresponding to ADCs in a frame sampled by a video signal processing system.

The interleaving controller 112 shown in FIG. 1 can perform different interleaving controls to reduce possible artificial display patterns caused by interleaving conversion between ADCs. First, please refer to FIG. 3, which illustrates a bitmap of image pixels corresponding to the ADCs 108 and 110 in a frame sampled by the video signal processing system 100. The ADC 108 samples odd pixels, while the ADC 110 samples even pixels. However, vertical line patterns might occur if there is a mismatch between the ADC 108 and the ADC 110, and thus flickers in the frame are visible to human eyes.

Figure 4:
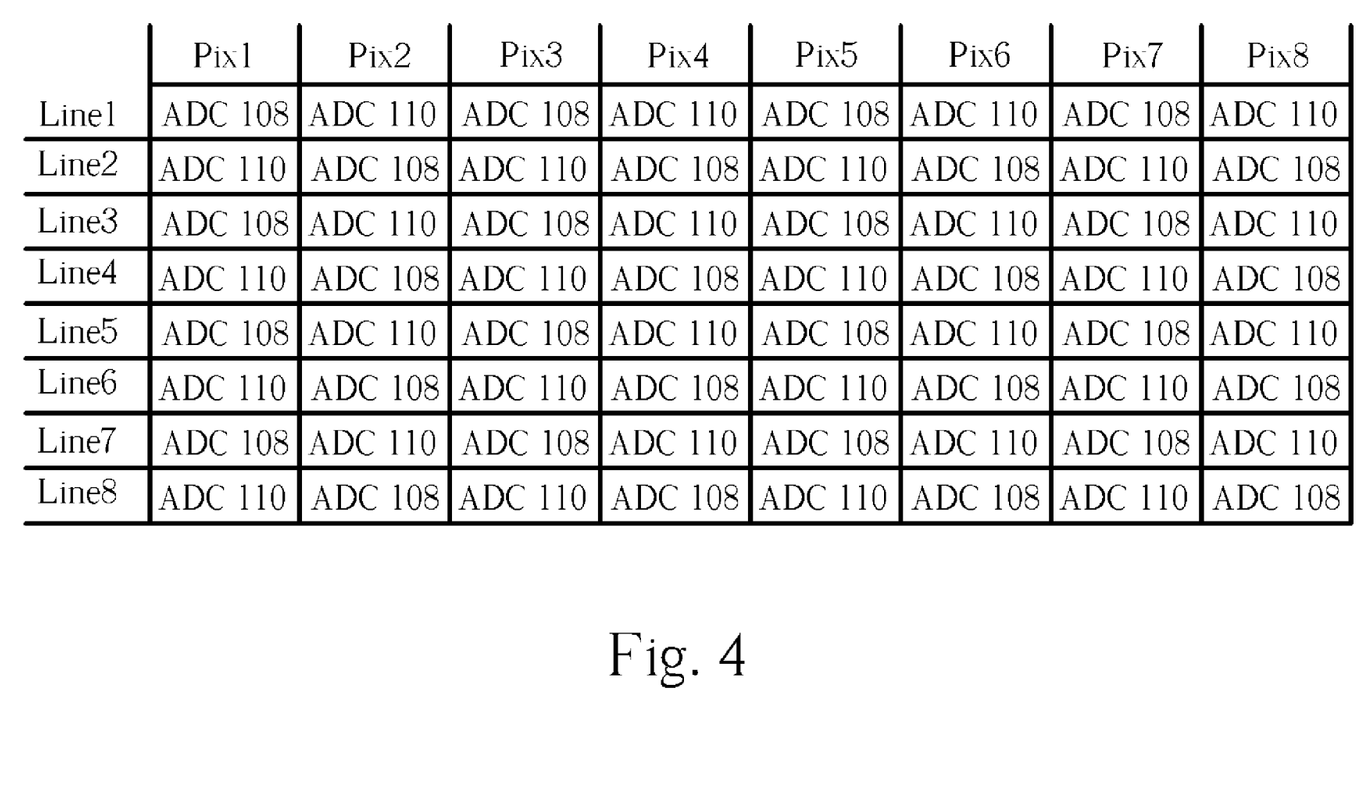
FIG. 4 illustrates a bitmap of image pixels corresponding to ADCs in a frame sampled by a video signal processing system with a one-line interleaving control.

Next, please refer to FIG. 4, which illustrates a bitmap of image pixels corresponding to the ADCs 108 and 110 in a frame sampled by the video signal processing system 100 with a one-line interleaving control. Odd lines are started from samplings of the ADC 108, while even lines are started from samplings of the ADC 110. Therefore, with the one-line interleaving control, it is less sensitive for human eyes if there is a mismatch between the ADC 108 and the ADC 110.

Figure 5:
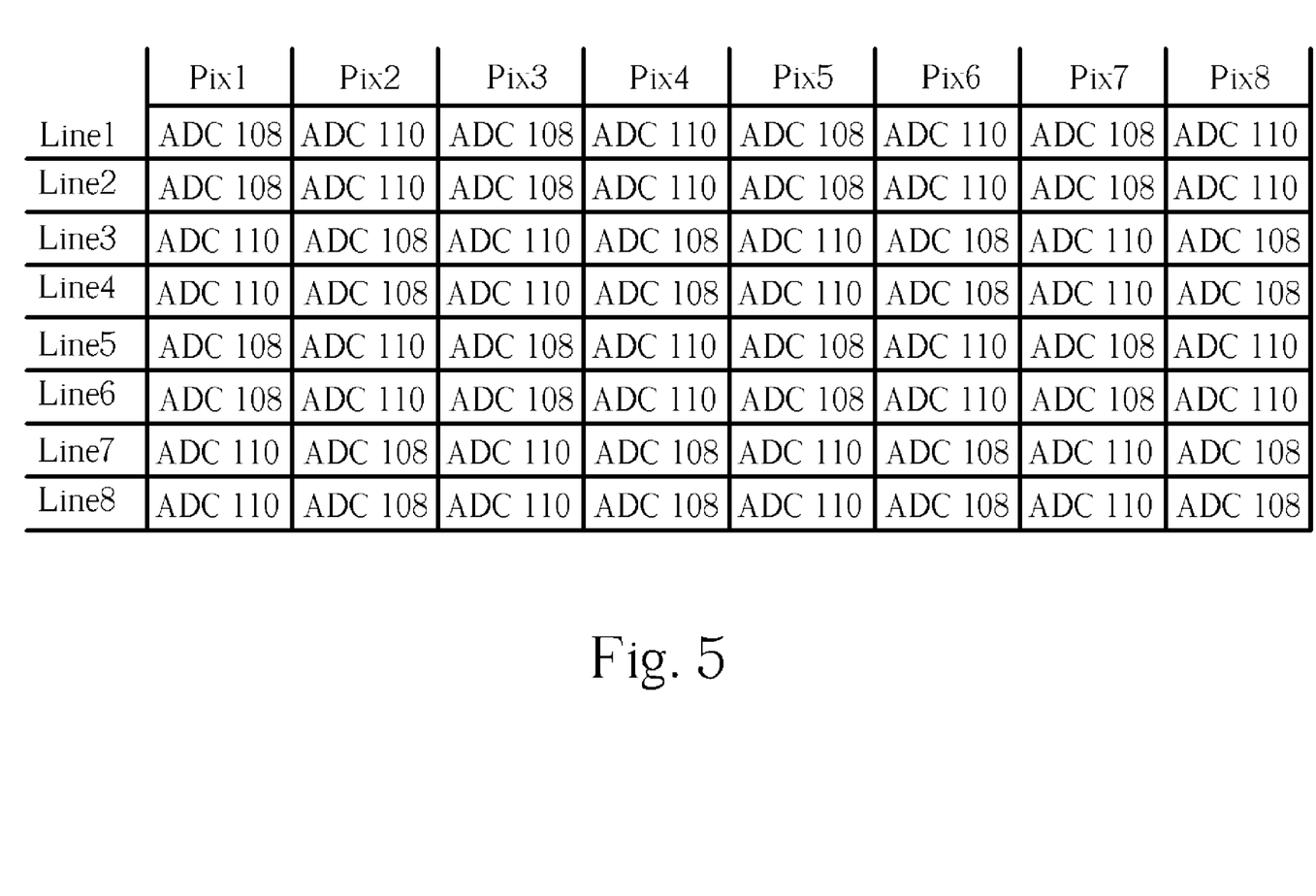
FIG. 5 illustrates a bitmap of image pixels corresponding to ADCs in a frame sampled by a video signal processing system with a two-line interleaving control.

Furthermore, please refer to FIG. 5, which illustrates a bitmap of image pixels corresponding to the ADCs 108 and 110 in a frame sampled by the video signal processing system 100 with a two-line interleaving control. Lines 1, 2, 5, and 6 are started from samplings of the ADC 108, while lines 3, 4, 7 and 8 are started from samplings of the ADC 110, meaning that the interleaving controller 112 alternates between the ADC 108 and the ADC 110 for starting pixels every two lines.

Figure 6:
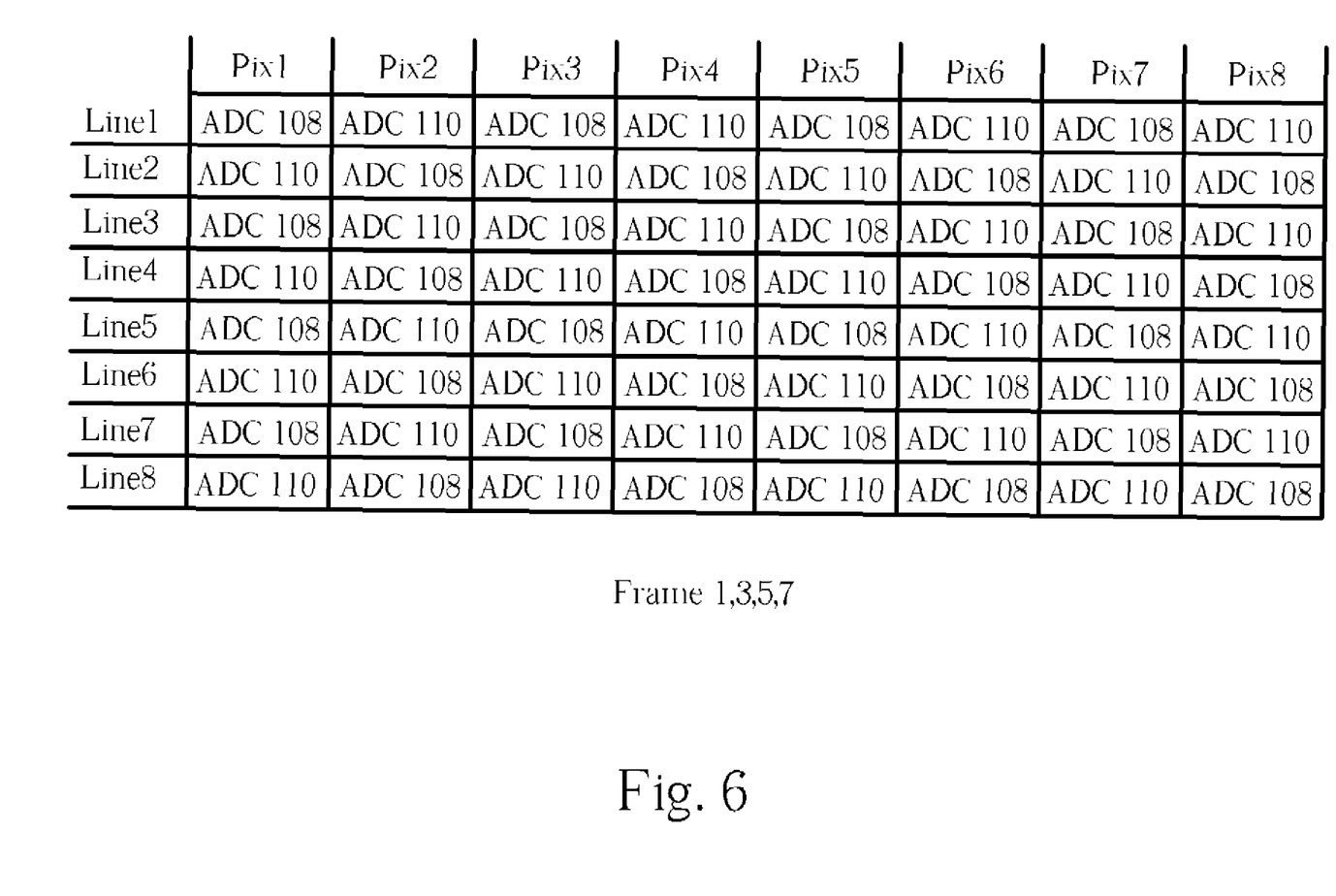
FIG. 6 and FIG. 7 illustrate bitmaps of image pixels corresponding to ADCs in frames sampled by a video signal processing system with a one-frame and one-line interleaving control.
Figure 7:
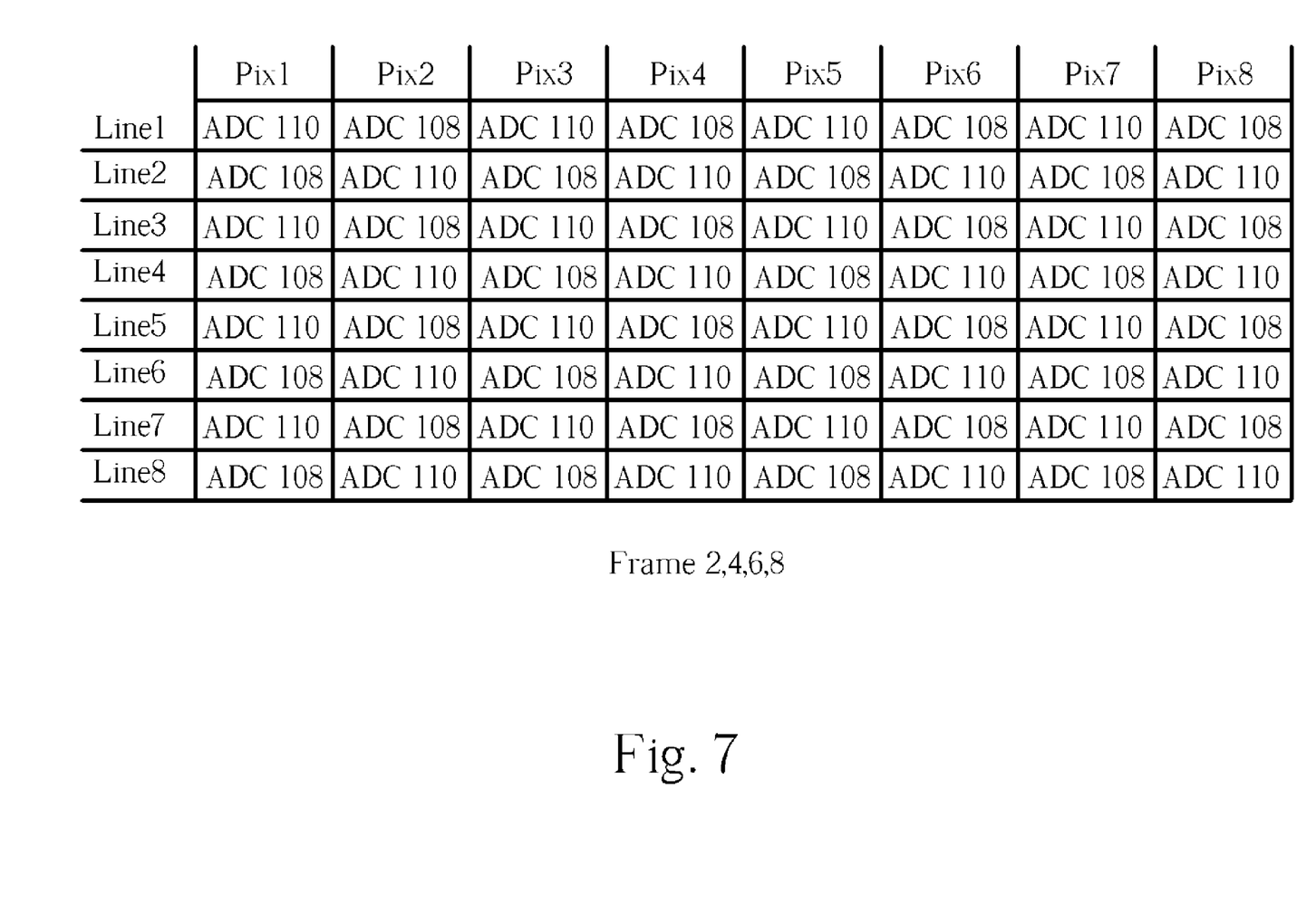
Figure 8:
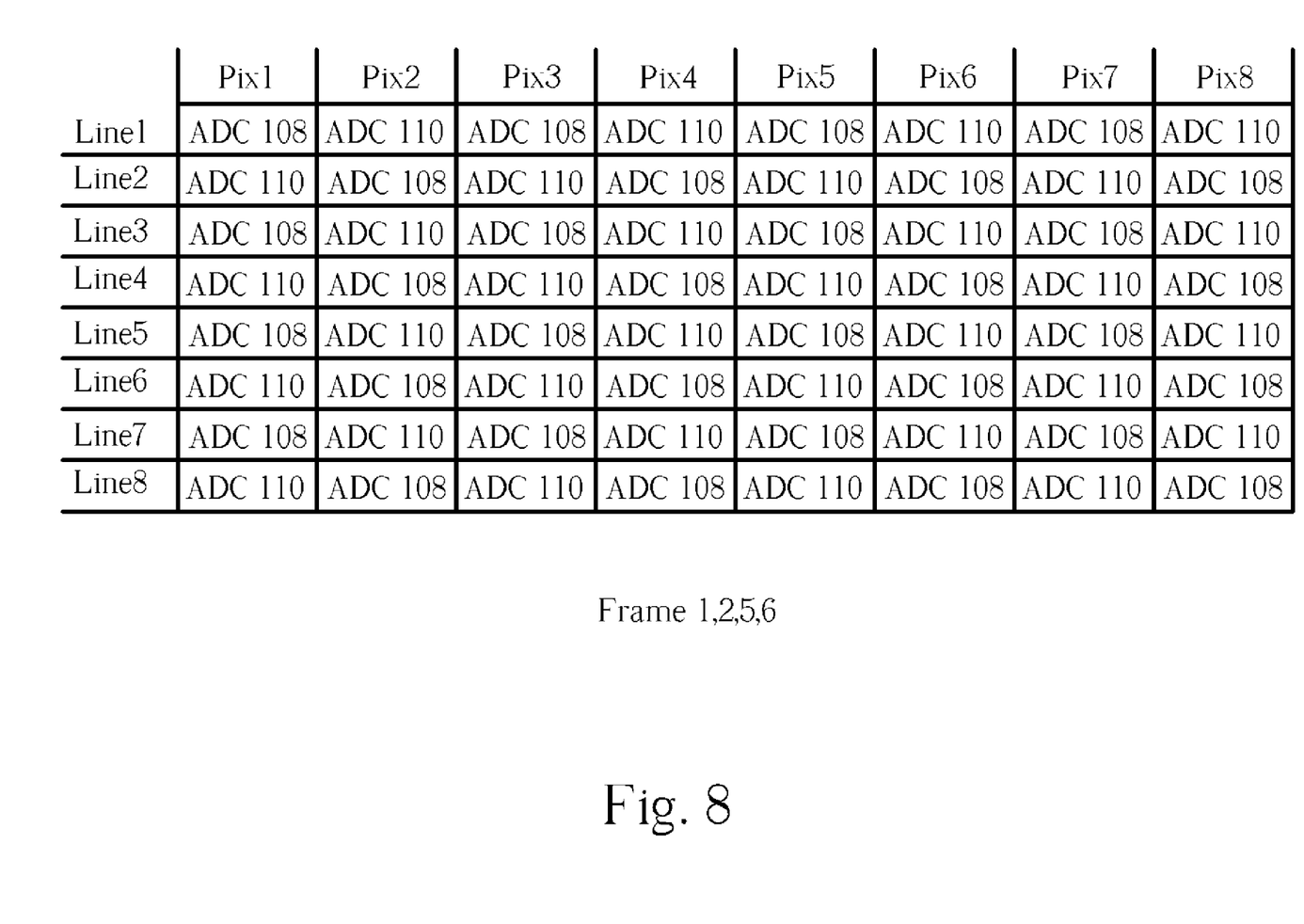
FIG. 8 and FIG. 9 illustrate bitmaps of image pixels corresponding to ADCs in frames sampled by a video signal processing system with a two-frame and one-line interleaving control.
Figure 9:
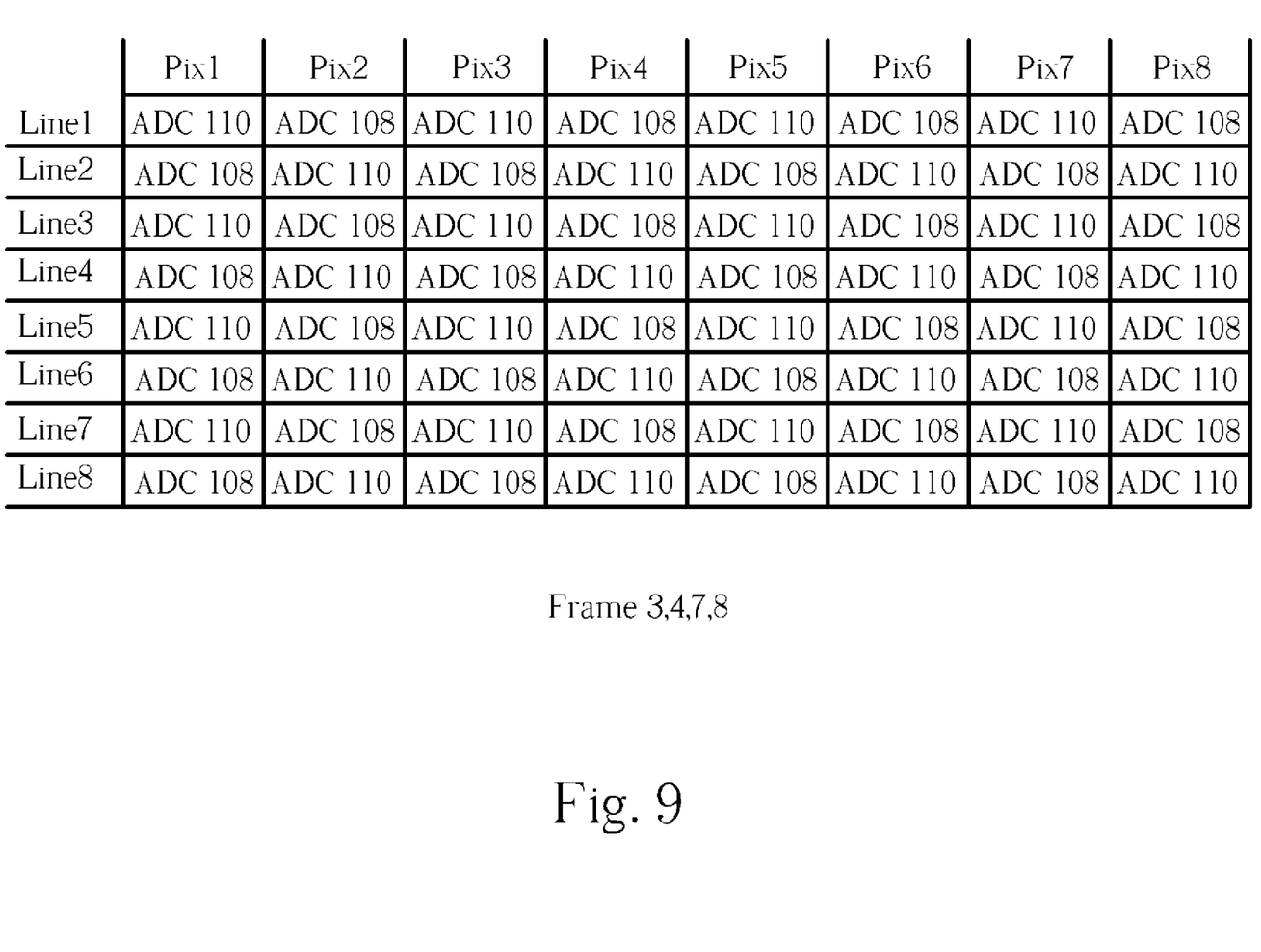

The interleaving controller 112 preferably performs interleaving controls by frames. As human eyes act as low pass filters from one to next frames, pixel differences caused by a mismatch between two ADCs are averaged and become less sensitive for human eyes with a frame interleaving. For example, please refer to FIG. 6 and FIG. 7, which illustrate bitmaps of image pixels corresponding to the ADCs 108 and 110 in frames sampled by the video signal processing system 100 with a one-frame and one-line interleaving control. FIG. 6 shows a bitmap of odd frames, while FIG. 7 shows another bitmap of even frames. Moreover, please refer to FIG. 8 and FIG. 9, which illustrate bitmaps of image pixels corresponding to the ADCs 108 and 110 in frames sampled by the video signal processing system 100 with a two-frame and one-line interleaving control. FIG. 8 shows a bitmap of two-frame intervals, while FIG. 9 shows another bitmap of the other two-frame intervals.

Other than the above-mentioned interleaving controls, the interleaving controller 112 can apply various interleaving controls for applications. According to the disclosed embodiments, persons skilled in the art should note that various modifications can be made without departing from the spirit of the present invention.

With the disclosed interleaving ADCs architecture, the matching between ADCs becomes an important issue in the system. The performance of an ADC is distorted as long as the ADC is used, so calibrations of the ADC become very important. Therefore, the present invention further provides a high-speed video signal processing system with calibration loops.

Figure 10:
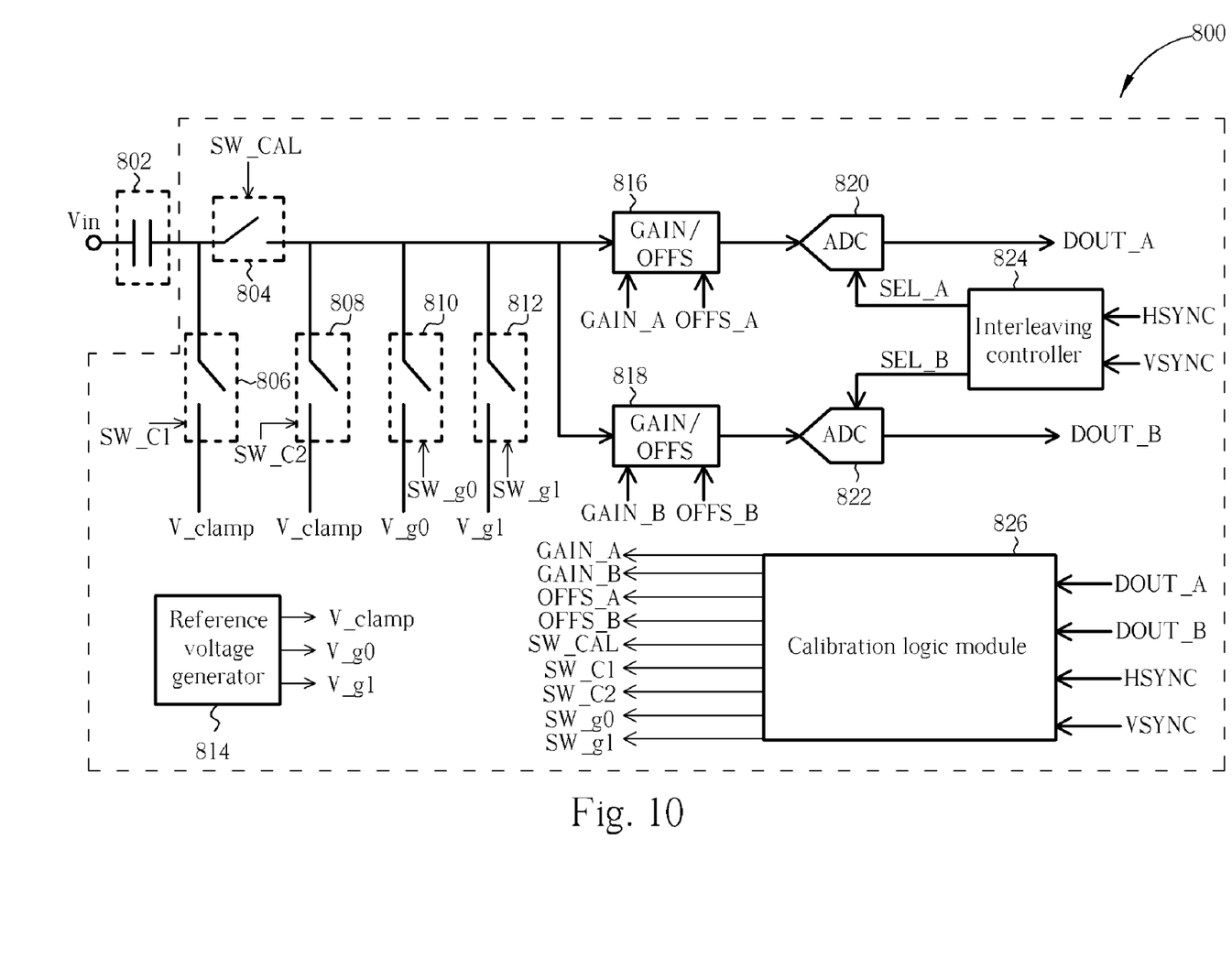
FIG. 10 illustrates a schematic diagram of a high-speed video signal processing system having calibration loops in accordance with the second embodiment of the present invention.

Please refer to FIG. 10, which illustrates a schematic diagram of a high-speed video signal processing system 800 having calibration loops in accordance with the second embodiment of the present invention. The high-speed video signal processing system 800 includes a capacitor 802, switches 804, 806, 808, 810, 812, a reference voltage generator 814, gain and offset coarse tuners 816, 818, ADCs 820, 822, an interleaving controller 824, and a calibration logic module 826. The capacitor 802 acts as a dc level storage for shifting dc level of input signals Vin to the internal ADC operation range. The switch 806 transmits a clamp voltage V_clamp provided by the reference voltage generator 814 to the ADCs 816 and 818 for serving a dc level clamp voltage. The calibration logic module 826 controls the switches 804, 806, 808, 810, and 812 with signals SW_CAL, SW_C1, SW_C2, SW_g0, and SW_g1 when performing calibrations, and generates control signals GAIN_A, GAIN_B, OFFS_A, and OFFS_B to the gain and offset coarse tuner 816 and 818 according to signals outputted from the ADCs 820 and 822, so as to adjust gain and offset levels to compensate gain and/or offset errors of the ADCs 820 and 822. The ADCs 820 and 822, controlled by the interleaving controller 824 with selection signals SEL_A and SEL_B, convert received analog signals to digital signals DOUT_A and DOUT_B by turns. The interleaving controller 824 selectively enables the ADCs 820 and 822 according to a predetermined sequence, and may change the sequence preferably in response to horizontal synchronization signal HSYNC and vertical synchronization signal VSYNC respectively. Therefore, the video signal processing system 800 performs a two-time (2×) conversion by interleaving the ADC 820 and the ADC 822, and a calibration feedback loop calibrates and reduces the gain and offset mismatches between the ADC 820 and the ADC 822.

The video signal processing system 800 achieves high speed by performing interleaving sampling and conversion on the ADCs 820 and 822 and achieves high accuracy with dynamical calibrations.

Figure 11:
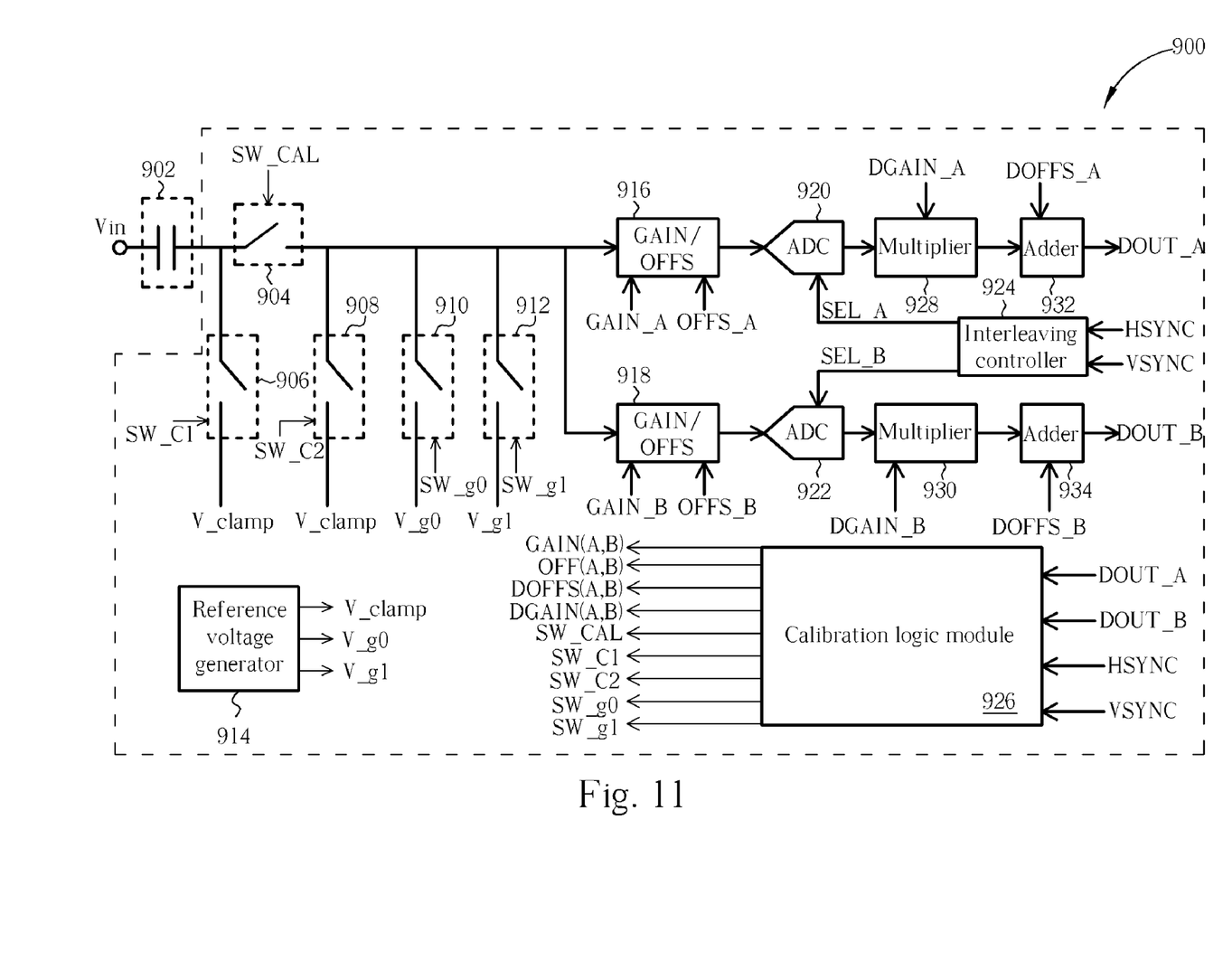
FIG. 11 illustrates a schematic diagram of a high-speed and high-accuracy video signal processing system in accordance with the third embodiment of the present invention.

Please refer to FIG. 11, which illustrates a schematic diagram of a high-speed and high-accuracy video signal processing system 900 in accordance with the third embodiment of the present invention. The video signal processing system 900 includes a capacitor 902, switches 904, 906, 908, 910, 912, a reference voltage generator 914, gain and offset coarse tuners 916, 918, ADCs 920, 922, an interleaving controller 924, a calibration logic module 926, multipliers 928, 930, and adders 932, 934 for digital fine tune. Operations of coarse tuning and signal conversions in the video signal processing system 900 are similar to the video signal processing system 800 shown in FIG. 8. The video signal processing system 900 further includes fine tune modules, the multipliers 928, 930, and the adders 932, 934. The multipliers 928 and 930 multiply signals outputted from the ADCs 920 and 922 by a value according to control signals DGAIN_A and DGAIN_B provided by the calibration logic module 926, so as to compensate gain errors of digital signals outputted from the ADCs 920 and 922. Also, the adders 932 and 934 add signals outputted from the multiplier 928 and 930 by a value according to control signals DOFFS_A and DOFFS_B provided by the calibration logic module 926, so as to compensate offset errors of digital signals outputted from the ADCs 920 and 922. With these digital multipliers and adders, fine gain and offset error is compensated and high accuracy matching between ADCs is achieved.

The calibration loop controller coupled to the analog to digital converters is capable of reducing gain and offset mismatches between ADCs. The interleaving sequence methodology between pixel, line and frame is capable of reducing possible artificial defects caused by interleaving ADCs in the system.

In the present invention, the video signal processing systems mentioned above can include a plurality of ADCs rather than only two ADCs. With more interleaving ADCs, the present invention can operate with a higher speed, so as to meet some special applications.

In summary, the present invention video signal processing system achieves high-speed conversions with the interleaving ADCs, and high-accuracy operations with the calibration loops formed by the coarse tuners, the fine tuners, and the calibration logic module, so as to increase efficiency and decrease the production cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high-speed video signal processing system comprising:
   a reception end for receiving analog signals;
   a plurality of analog to digital converters coupled to the reception end for converting analog signals received from the reception end to digital signals according to control signals;
   an interleaving controller coupled to the plurality of analog to digital converters for generating the control signals to selectively enable the plurality of analog to digital converters in response to a synchronization signals;

a switch module between the reception end and the plurality of analog to digital converters for transmitting received signals and reference voltages according to a plurality of control signals;

a reference voltage generator coupled to the switch module for providing the reference voltages;

a plurality of coarse tuners between the switch module and the plurality of analog to digital converters for coarse-tuning signals to be inputted to the plurality of analog to digital converters; and a calibration logic module for controlling the switch module, and the plurality of coarse tuners according to signals outputted from the plurality of analog to digital converters, so as to compensate errors of signals outputted from the plurality of the analog to digital converters.

2. The high-speed video signal processing system of claim 1 further comprising a de-coupling capacitor between the reception end and the plurality of analog to digital converters for removing quantization errors of input signals to shift said receiving analog signals to an internal operation range.

3. The high-speed video signal processing system of claim 1 further comprising a clamp switch coupled to inputs of the plurality of analog to digital converters.

4. The high-speed video signal processing system of claim 3 further comprising a clamp voltage generator for providing a clamp voltage through the clamp switch.

5. The high-speed video signal processing system of claim 1, wherein each of the plurality of coarse tuners comprises:

an analog gain tuner for coarse-tuning gain levels of received signals according to a first control signal provided by the calibration logic module; and an analog offset tuner for coarse-tuning direct-current levels of received signals according to a second control signal provided by the calibration logic module.

6. The high-speed video signal processing system of claim 1 further comprising:

a plurality of fine tuners coupled to outputs of the plurality of analog to digital converters for fine-tuning signals outputted from the plurality of analog to digital converters; and a calibration logic module for controlling the switch module, and the plurality of fine tuners according to signals outputted from the plurality of fine tuners, so as to compensate errors of signals outputted from the plurality of the analog to digital converters.

7. The high-speed video signal processing system of claim 6, wherein each of the plurality of fine tuners comprises:

a digital multiplier for multiplying received digital signals by a value provided by the calibration logic module, so as to compensate gain errors of signals outputted from the plurality of the analog to digital converters; and a digital adder for adding received digital signals with a value provided by the calibration logic module, so as to compensate offset errors of signals outputted from the plurality of the analog to digital converters.

8. The high-speed video signal processing system of claim 1, wherein said synchronization signal comprises a horizontal synchronization signal and a vertical synchronization signal.

9. The high-speed video signal processing system of claim 1, wherein said synchronization signal is a horizontal synchronization signal.

10. The high-speed video signal processing system of claim 1, wherein said interleaving controller selectively enables the plurality of analog to digital converters according to a predetermined sequence in response to the synchronization signal.

* * * * *